United States Patent [19]

Okuma

[11] 4,199,732
[45] Apr. 22, 1980

[54] AMPLIFYING CIRCUIT

[75] Inventor: Tatsuhiko Okuma, Tokyo, Japan

[73] Assignee: Trio Kabushiki Kaisha, Tokyo, Japan

[21] Appl. No.: 911,079

[22] Filed: May 31, 1978

[51] Int. Cl.² .............................................. H03F 3/18
[52] U.S. Cl. .................................... 330/267; 330/255; 330/302
[58] Field of Search ............... 179/1 A; 330/267, 268, 330/302, 273, 274, 296, 255, 263

[56] References Cited

U.S. PATENT DOCUMENTS

| | | | |
|---|---|---|---|
| 3,760,288 | 9/1973 | Leonard | 330/255 |
| 3,883,813 | 5/1975 | Sekiya | 330/268 |

*Primary Examiner*—James B. Mullins
*Attorney, Agent, or Firm*—Gerald J. Ferguson, Jr.; Joseph J. Baker

[57] ABSTRACT

An amplifying circuit comprising an input terminal to which an alternating current signal is applied; a first transistor; a second transistor where one of the first and second transistors is a NPN transistor and the other is a PNP transistor; an output terminal to which is connected the respective collectors of the first and second transistors means for operating the second transistor as a constant current source; and connecting means for connecting the alternating current signal at the input terminal to the respective bases of the first and second transistors where the connecting means includes a capacitor connected between the input terminal and the base of the second transistor to thereby connect to the second transistor substantially only those frequencies of the alternating current signal which are at least as high as the cut-off frequency of the first transistor although frequencies below the cut-off frequency may also be coupled to the second transistor in a further embodiment of this invention.

14 Claims, 5 Drawing Figures

AMPLIFYING CIRCUIT

BACKGROUND OF THE INVENTION

1. Field of the Invention

This invention relates to an improved amplifying circuit for use in an audio amplifier or the like.

2. Discussion of the Prior Art

An illustrative embodiment of a conventional amplifying circuit for use in audio amplifier is shown in FIG. 1 where 1 is an input terminal connected to the base of a NPN transistor 2. 3 is a B+ terminal and 4 is a B− terminal. The resistors 5 and 6 are connected between two terminals 3 and 4 in series, the mid point between resistor 5 and resistor 6 being connected to the base of transistor 2. The emitter of transistor 2 is connected to B− terminal 4 by way of resistor 7 and the collector is connected in common with the collector of a PNP transistor 8 to an output terminal 9. A series circuit comprising a diode 10, a resistor 11 and a resistor 12 is connected between B+ terminal 3 and B− terminal 4 where the mid-point between resistor 11 and resistor 12 is connected to the base of transistor 8. The collector of transistor 8 is connected to B+ terminal 3 by way of resistor 13.

In an amplifying circuit thus constructed, the input signal is amplified by transistor 2 and outputted at output terminal 9 where transistor 8 operates as a constant-current transistor.

The pulse response characteristics (high frequency characteristics) in such an amplifying circuit will now be discussed. When a pulse signal such as shown in FIG. 2(A) is applied to terminal 1, the pulse signal is amplified by transistor 2 as shown in FIG. 2(B) and outputted at output terminal 9. Transistor 2 operates in the on-direction when the pulse signal is rising and in the off-direction when it is falling. It responds quickly in the on-direction; but its response in the off-direction is slow. Therefore, when the output pulse signal waveform shown in FIG. 2(B) is compared to the input pulse signal waveform shown in FIG. 2(A), the rise shows the steep characteristic identical to the input pulse signal waveform, but the fall is different from the steep input pulse waveform and, in fact, is sloped. In other words, in the case of the above-mentioned amplifying circuit, the output pulse signal waveform deviates from the input pulse signal waveform. It has a shortcoming in that the high frequency characteristics are poor.

SUMMARY OF THE INVENTION

The present invention was made in view of the foregoing problem and a primary object is to provide an amplifying circuit with improved high frequency characteristics.

Other objects and advantages of this invention will be apparent from a reading of the following specification and claims taken with the drawing.

DETAILED DESCRIPTION OF PREFERRED EMBODIMENTS

Figure 1:
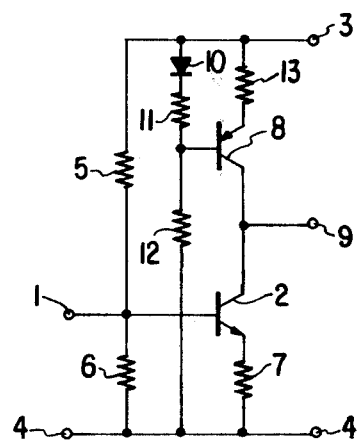
FIG. 1 is a circuit diagram of a conventional amplifying circuit.
Figure 2:
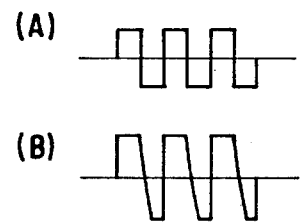
FIGS. 2(A) and 2(B) are waveform diagrams which illustrate the operation of the conventional circuit of FIG. 1.

Reference should be made to the drawing where like reference numerals refer to like parts.

Figure 3:
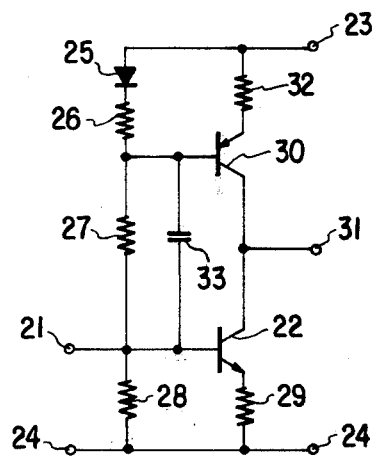
FIG. 3 is a circuit diagram of an illustrative embodiment of an amplifying circuit in accordance with the present invention.

FIG. 3 is a circuit diagram of one illustrative embodiment where 21 is an input terminal connected to the base of a NPN transistor 22. 23 is a B+ terminal and 24 is a B− terminal. A series circuit comprising diode 25, resistor 26, resistor 27 and resistor 28 is connected between the two terminals 23 and 24 where the mid-point between resistor 27 and resistor 28 is connected to the base of NPN transistor 22. The emitter of transistor 22 is connected to the B− terminal 24 by way of a resistor 29 and the collector is connected in common with the collector of a PNP transistor 30 to an output terminal 31. The base of transistor 30 is connected to the mid-point between resistor 26 and resistor 27 and the emitter is connected to B+ terminal 23 by way of resistor 32. The base of transistor 22 and the base of transistor 30 are connected by a capacitor 33. The value of capacitor 33 is so selected that the base of transistor 22 and transistor 30 are effectively connected with respect to high frequency components at or above the vicinity of the cut-off frequency of transistor 22.

The operation of the above amplifying circuit is as follows. It operates in two ways depending upon whether the input signal frequency is above or below the vicinity of the cut-off frequency of the transistor 22. When the input signal frequency is at or below the vicinity of the cut-off frequency of transistor 22, the input signal is amplified by transistor 22 and outputted at output terminal 31 and transistor 30 operates as a constant-current transistor. On the other hand, when the input signal frequency is at or above the vicinity of the cut-off frequency of the transistor 22, the input signal is amplified by the pair of transistors 22 and 30 and outputted at output terminal 31. In other words, the base of transistor 22 and the base of transistor 30 are connected by capacitor 33 with respect to high frequency components at or above the vicinity of the cut-off frequency of transistor 22. Consequently, when the input signal frequency is at or above the vicinity of the cut-off frequency of transistor 22, the input signal is applied to the bases of transistor 22 and transistor 30. Thus, the pair of transistors 22 and 30 act as amplifying elements and the input signal is amplified by the pair of transistors 22 and 30.

Figure 4:
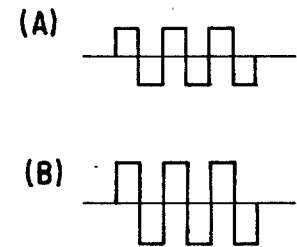
FIGS. 4(A) and 4(B) are waveform diagrams which illustrate the operation of the FIG. 3 circuit.

The pulse-response characteristics (the high frequency characteristics) of the above amplifying circuit will now be described—that is, when the frequency is at or above the vicinity of the cut-off frequency of the transistor 22. When a pulse signal as in FIG. 4(A) is applied, the pulse signal is amplified by transistors 22 and 30 as shown in FIG. 4(B) and outputted at output terminal 31. Transistor 22 operates in the on-direction when the pulse signal is rising and operates in the off-direction when it is falling whereas transistor 30 operates in the off-direction when the pulse signal is rising and operates in the on-direction when it is falling. Therefore, when the output pulse signal waveform shown in FIG. 4(B) is considered, it shows a steep rising characteristic identical to the rising of the input pulse signal waveform due to the fast response of transistor 22 in the on-direction. The fall also has a steep characteristic identical to the fall of the input pulse signal waveform due to the fast response of transistor 30 in the on-direction. In other words, when this amplifying circuit is used, the output pulse signal waveform becomes identical to the input pulse signal waveform and good high frequency characteristics are obtained.

Figure 5:
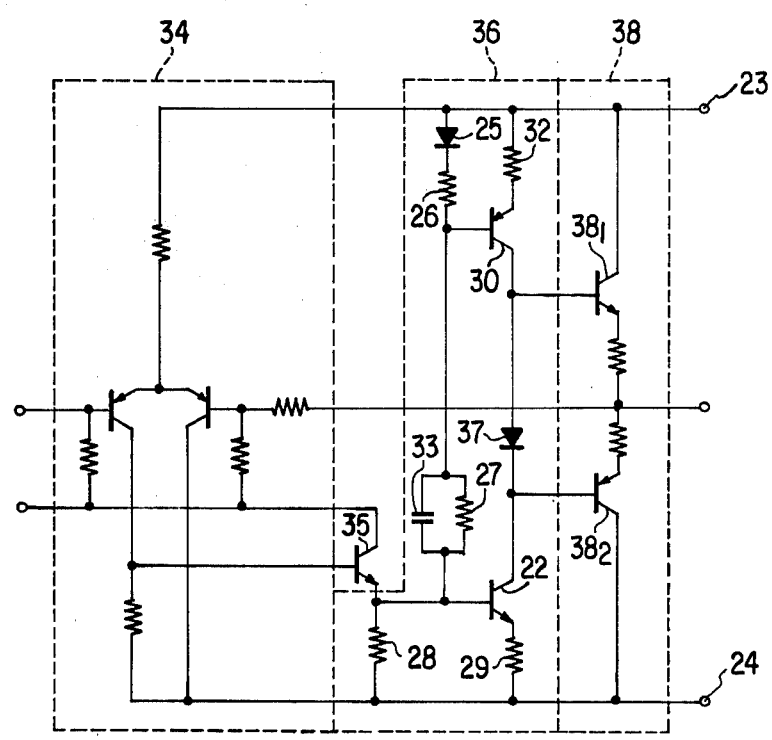
FIG. 5 is a circuit diagram of an illustrative embodiment of an entire audio amplifier using an amplifying circuit based on the present invention.

FIG. 5 is a circuit diagram of an illustrative embodiment of an entire audio amplifier in which the above amplifier circuit may be used where 34 is a first stage differential amplifier, 35 is a next stage emitter-follower transistor, and the above amplifying circuit (labelled 36) is connected to the output of emitter-follower transistor 35. Also, in amplifying circuit 36, the collectors of transistors 22 and 30 are connected in common by way of diode 37. 38 is an output amplifier, and the bases of a NPN type transistor 38$_1$ and a PNP type transistor 38$_2$ are respectively connected to the collectors of transistors 30 and 22. Thus, the input signal, after being amplified by differential amplifier 34, is amplified by transistor 22 or transistors 22 and 30 by way of emitter-follower transistor 35 and further amplified at output amplifier 38.

In the above practical embodiment, the pair of transistors 22 and 30 operate as amplifying elements for the high frequency components at or above the vicinity of the cut-off frequency of transistor 22. However, the size of capacitor 33 may be increased so that the pair of transistors 22 and 30 also operate as amplifying elements in the audio frequency band.

Therefore, when an amplifying circuit based on the design described above is used, high frequency characteristics are improved because transistor 30 along with transistor 22 are designed to operate as amplifying elements. Construction is also simple since only capacitor 33 is added to the FIG. 1 circuit, yet the advantages obtained are substantial.

What is claimed is:

1. An amplifying circuit comprising
   an input terminal to which an alternating current input signal is applied;
   a first transistor;
   a second transistor where one of said first and second transistors is a NPN transistor and the other is a PNP transistor;
   an output terminal to which is connected the respective collectors of said first and second transistors;
   means for operating said second transistor as a constant current source; and
   frequency sensitive connecting means for connecting said input signal to the respective bases of said first and second transistors so that at frequencies above a predetermined frequency of said input signal, (a) said second transistor no longer functions as a constant current source and (b) said first and second transistors function as a push-pull amplifier for said input signal.

2. An amplifying circuit as in claim 1 including a differential amplifier to which an input signal is applied, and an emitter follower amplifier responsive to said differential amplifier to provide said alternating current signal.

3. An amplifying circuit as in claim 2 including load means connected between said collectors of said first and second transistors and an output amplifier having third and fourth transistors where the bases of said third and fourth transistors are respectively connected to the said collectors of said first and second transistors.

4. An amplifying circuit as in claim 1 where said predetermined frequency corresponds to the cut-off frequency of said first transistor.

5. An amplifying circuit as in claim 4 where said frequency sensitive connecting means includes at least one capacitor connected between said input terminal and said base of the second transistor.

6. An amplifying circuit as in claim 4 where the frequency spectrum of said alternating current input signal includes at least the audio frequencies.

7. An amplifying circuit as in claim 4 where said first transistor and second transistors are respectively NPN and PNP transistors.

8. An amplifying circuit comprising
   an input terminal to which an alternating current signal is applied;
   a first transistor;
   a second transistor where one of said first and second transistors is a NPN transistor and the other is a PNP transistor;
   an output terminal to which is connected the respective collectors of said first and second transistors;
   means for operating said second transistor as a constant current source; and
   connecting means for connecting said alternating current signal at said input terminal to the respective bases of said first and second transistors where said connecting means includes frequency sensitive means for connecting to said second transistor substantially only those frequencies of the alternating current signal which are at least as high as the cut-off frequency of said first transistor.

9. An amplifying circuit as in claim 8 where said frequency sensitive means is at least one capacitor connected between said input terminal and said base of the second transistor.

10. An amplifying circuit as in claim 9 where the frequency spectrum of said alternating current signal includes at least the audio frequencies.

11. An amplifying circuit as in claim 8 where said first transistor and second transitors are respectively NPN and PNP transistors.

12. An amplifying circuit comprising
    an input terminal to which an alternating current signal is applied where the frequency spectrum of said alternating current signal includes at least the audio frequencies;
    a first transistor;
    a second transistor where one of said first and second transistors is a NPN transistor and the other is a PNP transistor;
    an output terminal to which is connected the respective collectors of said first and second transistors;
    means for operating said second transistor as a constant current source; and
    connecting means for connecting said alternating current signal at said input terminal to the respective bases of said first and second transistors where said connecting means includes frequency sensitive means for connecting to said second transistor substantially only those frequencies of the alternating current signal which are above a frequency which is one of said audio frequency but which is less than the cut-off frequency of said first transistor.

13. An amplifying circuit as in claim 12 where said frequency sensitive means is at least one capacitor connected between said input terminal and said base of the second transistor.

14. An amplifying circuit as in claim 13 where said first transistor and second transistor are respectively NPN and PNP transistors.

* * * * *